United States Patent
Ishida et al.

(10) Patent No.: US 6,429,083 B1
(45) Date of Patent: Aug. 6, 2002

(54) REMOVABLE SPACER TECHNOLOGY USING ION IMPLANTATION TO AUGMENT ETCH RATE DIFFERENCES OF SPACER MATERIALS

(75) Inventors: Emi Ishida, Sunnyvale; Srinath Krishnan, Campbell; Ming Hao; Effiong Ibok, both of Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/598,797

(22) Filed: Jun. 21, 2000

Related U.S. Application Data (60) Provisional application No. 60/155,562, filed on Sep. 24, 1999.

(51) Int. Cl.$^7$ ............................................. H01L 21/336
(52) U.S. Cl. ........................ 438/305; 438/303; 438/595
(58) Field of Search .................................. 438/305, 306, 438/303, 199, 595, 585, 230, 231

(56) References Cited

U.S. PATENT DOCUMENTS

| | | | | |
|---|---|---|---|---|
| 5,534,107 A | * | 7/1996 | Gray et al. ............... | 156/643.1 |
| 5,844,276 A | * | 12/1998 | Fulford et al. ............... | 257/336 |
| 5,943,565 A | * | 8/1999 | Ju ............................... | 438/232 |
| 6,037,204 A | * | 3/2000 | Chang et al. ............... | 438/305 |
| 6,107,149 A | * | 8/2000 | Wu et al. .................... | 438/305 |
| 6,218,224 B1 | * | 4/2001 | Lukanc et al. ............... | 438/199 |
| 6,342,423 B1 | * | 1/2002 | Ishida et al. ................ | 438/305 |
| 6,344,396 B1 | * | 2/2002 | Ishida et al. ................ | 438/286 |

FOREIGN PATENT DOCUMENTS

JP 03-019348 A * 1/1991

OTHER PUBLICATIONS

Wolf et al, Silicon Processing for the VISI Era, vol. 1, 1986, pp. 532–534.*

* cited by examiner

*Primary Examiner*—Michael Trinh (57) ABSTRACT

Submicron-dimensioned MOS and/or CMOS transistors are fabricated by a process employing removable sidewall spacers made of a material, such as UV-nitride, which has been treated subsequent to its deposition, e.g., by ion implantation, to augment its etch rate with a room temperature etchant, e.g., dilute aqueous HF. The treated spacers are removed with the dilute, aqueous HF after implantation of moderately or heavily-doped source/drain regions but prior to any post-implantation annealing processing, in order not to increase the etch resistance of the spacer material by thermally-induced densification.

31 Claims, 2 Drawing Sheets

REMOVABLE SPACER TECHNOLOGY USING ION IMPLANTATION TO AUGMENT ETCH RATE DIFFERENCES OF SPACER MATERIALS

CROSS-REFERENCE TO PROVISIONAL APPLICATION

This application claims priority from U.S. Provisional Application Serial No. 60/155,562 filed Sep. 24, 1999, the entire disclosure of which is incorporated herein by reference.

FIELD OF THE INVENTION

This application contains subject mater similar to subject matter disclosed in U.S. patent application Ser. No. 09/667,781 filed on Sep. 22, 2000, U.S. Pat. No. 6,342,423 and Ser. No. 09/667,787 filed on Sep. 22, 2000 pending.

The present invention relates to a method of manufacturing semiconductor devices, e.g., MOS-type transistors and integrated circuits comprising such devices, with improved processing methodology resulting in increased reliability and quality, increased manufacturing throughput, and reduced fabrication cost. The present invention is also useful in the manufacture of CMOS semiconductor devices and has particular applicability in fabricating high-denisity integration semiconductor devices with design features below about 0.18 $\mu$m, e.g., about 0.15 $\mu$m and below.

BACKGROUND OF THE INVENTION

The escalating requirements for high density and performance associated with ultra large-scale integration (ULSI) semiconductor devices require design features of 0.18 $\mu$m and below, such as 0.15 $\mu$m and below, increased transistor and circuit speeds, high reliability, and increased manufacturing throughput for economic competitiveness. The reduction of design features to 0.18 $\mu$m and below challenges the limitations of conventional semiconductor manufacturing techniques.

As feature sizes of MOS and CMOS devices are reduced into the sub-micron range, so-called "short-channel" effects arise which tend to limit device performance. For n-channel MOS transistors, the major limitation encountered is caused by hot-electronic-induced instabilities. This problem is attributed to high electrical fields between the source and drain, particularly near the drain, such that charge carriers, either electrons or holes, are injected into the gate or semiconductor substrate. Injection of hot carriers into the gate can cause gate oxide charging and threshold voltage instabilities which accumulate over time and greatly degrade device performance. In order to counter and thus reduce such instabilities, lightly-doped source/drain extension type transistor structures have been developed, as described below.

For p-channel MOS transistors of short-channel type, the major limitation on performance arises from "punch-through" effects which occur with relatively deep junctions. In such instances, there is a wider sub-surface depletion effect and it is easier for the field lines to go from the drain to the source, resulting in the above-mentioned "punch-through" current problems and device shorting. To minimize this effect, relatively shallow junctions are employed in forming p-channel MOS transistors.

The most satisfactory solution to date of hot carrier instability problems of MOS devices is the provision of lightly- or moderately-doped source/drain extensions driven just under the gate region, while the heavily-doped drain region is laterally displaced away from the gate by use of a sidewall spacer on the gate. Such structures are particularly advantageous because they do not have problems with large lateral diffusion and the channel length can be set precisely.

Several processing sequences or schemes have been developed for the manufacture of source/drain extension-type MOS and CMOS transistors for use in high-density integration applications, with a primary goal of simplifying the manufacturing process by reducing and/or minimizing the requisite number of processing steps. Conventional processing schemes for making such MOS transistors generally employ disposable spacers made of various materials, e.g., polysilicon, silicon oxides, silicon nitrides, silicon oxynitrides, and combinations thereof.

According to one conventional process scheme, a precursor structure comprising a semiconductor substrate of one conductivity type having a layer stack comprising a thin gate oxide layer and an overlying gate electrode formed on a portion of a surface thereof is subjected to ion implantation prior to sidewall spacer formation, for forming lightly- or moderately-doped implants therein. Following post-implantation annealing, sidewall spacers are formed on the pair of opposing side surfaces of the layer stack by first depositing a dielectric spacer material layer over the substrate surfaces and then removing same from the horizontally-oriented regions, i.e., the top surface of the gate electrode layer and the source and drain regions, by means of anisotropic etching. Such processing results in sidewall spacers left on the side surfaces of the gate layer stack that have an approximately quarter-circular shaped cross-section. The dielectric sidewall spacers typically remain through the balance of junction formation processing. After sidewall spacer formation, a heavy source/drain implantation is performed, with the gate layer stack and associated sidewall spacers acting as implantation masking materials. As a consequence of the separate implantations, the heavily-doped source/drain regions are laterally displaced from the gate edges by the thickness of the sidewall spacer material and the lightly- or moderately-doped regions beneath the sidewall spacers act as source/drain extensions.

According to another conventional process scheme employing disposable (i.e., removable) sidewall spacers, a precursor structure as described above and comprising a semiconductor substrate of one conductivity type having a layer stack comprising a thin gate oxide layer and an overlying gate electrode layer formed on a portion of a surface thereof is subjected to blanket-type dielectric layer deposition and patterning to form sidewall spacer layers on opposing side surfaces of the layer stack. Opposite conductivity type p- or n-type dopant impurities are then implanted into the substrate using the layer stack with sidewall spacers formed thereon as an implantation mask, to thereby form moderately- to heavily-doped implants. High temperature annealing is then performed to thermally activate the implanted dopant by diffusion and reduce lattice damage due to implantation, thereby forming source/drain regions and junctions at a predetermined dopant density and depth below the substrate surface. The effective length of the channel of such transistors is determined by the width of the gate insulator/gate electrode layer stack and the width of the sidewall spacers formed thereon. After activation annealing, the sidewall spacers are removed, as by etching, and a second implantation process for implanting n- or p-type opposite conductivity type dopant impurities is performed using only the gate insulating layer/gate electrode layer stack as an implantation mask, thereby forming shallow-depth, lightly- or moderately-doped implants in the substrate in the spaces between the deeper, more heavily-doped source/drain regions. Following this implantation, a second activation process, e.g., rapid thermal annealing (RTA), is performed for effecting dopant diffusion/activation and relaxation of implantation-induced lattice damage of the implants, to form shallow-depth, lightly- or moderately-doped source/drain extensions extending from respective proximal edges of the heavily-doped source/drain regions to just below the respective proximal edges of the gate insulator layer/gate electrode layer stack.

In a variant of the above-described process, the sidewall spacers are comprised of a layer of a first (or inner) dielectric material and a layer of a second (or outer) dielectric material. According to this variant, only the second, or outer, dielectric sidewall spacer layer is removed subsequent to annealing for forming the moderately- to heavily-doped source/drain regions. The first, or inner, dielectric sidewall spacer layer is retained for protecting the gate insulator/gate electrode layer stack during subsequent processing, e.g., for contact formation.

Each of the above-described variants employ removable. sidewall spacers as part of an implantation mask for defining the channel lengths, and each incurs a drawback in that the materials conventionally used for the sidewall spacers, such as those mentioned above, frequently are difficult and time consuming to remove and remove selectively by standard etching methodologies, particularly when densified as a result of high temperature processing for post-implantation annealing for dopant activation/lattice damage relaxation. For example, and as described in U.S. Pat. No. 5,766,991, removal of silicon nitride-based spacer layers can require etching in a hot phosphoric acid ($H_3PO_4$) bath at about 180° C. for approximately 1.5 hours. Such long etching time results in reduced manufacturing throughput and the extended exposure to and concomitant attack by the corrosive etchant at high temperature results in undesired etching and defect formation. Moreover, portions of the workpiece substrate not intended to be etched must be provided with an etch-resistant protective barrier layer, e.g., of silicon oxide, prior to etching. However, the etching resistance of the silicon oxide layer itself to the hot $H_3PO_4$ may be insufficient, in which case the resistance thereof must be increased prior to etching, e.g., by first annealing it at about 900° C. in an oxygen ambient. Alternatively, resistance to attack by the hot $H_3PO_4$ may be obtained by use of an oxide-polysilicon bi-layer. In either case, such requirement for provision of at least one layer for protecting from acid attack disadvantageously adds processing time, complexity, and fabrication cost. Etching of annealed, densified silicon oxide and/or silicon oxynitride-based sidewall spacer layers is similarly difficult.

Thus a need exists for improved semiconductor manufacturing methodology for fabricating MOS and CMOS transistors which does not suffer from the above-described drawbacks associated with the difficulty in conveniently and rapidly removing densified sidewall spacers according to conventional etching techniques. Moreover, there exists a need for an improved process for fabricating MOS transistor-based devices which is fully compatible with conventional process flow and provides increased manufacturing throughput and product yield.

The present invention fully addresses and solves the above-described problems and drawbacks attendant upon conventional processing for forming submicron-dimensioned MOS and CMOS transistors for use in high-density semiconductor integrated circuit devices, particularly in providing a process utilizing first (or inner) and second (or outer) dielectric sidewall spacer layers, the second, or outer, spacers being formed of a dielectric material which is selectively subjected to a post-formation treatment for increasing the etchability thereof vis-à-vis that of its as-deposited state, wherein the treated second, or outer, spacers are removed prior to any post-implantation thermal annealing treatment for dopant activation/lattice damage relaxation which may densify and thus increase the etching resistance thereof. The first, or inner, spacers are formed of a dielectric material and are retained throughout processing for protecting the gate insulator/gate electrode layer stack from attack by corrosive etchant and during subsequent ohmic contact formation. In embodiments according to the present invention, the first (inner) and second (outer) sidewall spacers are formed of the same dielectric material, and thus effectively constitute a single spacer; whereas, in other embodiments according to the present invention, single sidewall spacers are formed of a single dielectric material, and only the outer portions thereof are subjected to ion implantation for selectively augmenting the etch rate thereof.

DISCLOSURE OF THE INVENTION

An advantage of the present invention is an improved method for manufacturing MOS and/or CMOS transistor devices utilizing a removable spacer.

Another advantage of the present invention is an improved method for increasing the etchability of dielectric spacer materials utilized in the manufacture of MOS, CMOS, and other types of semiconductor devices.

Yet another advantage of the present invention is an improved method for manufacturing MOS and/or CMOS transistor devices utilizing a removable sidewall spacer formed of a readily etchable dielectric material.

Still another advantage of the present invention is an improved method of manufacturing submicron-dimensioned MOS transistors for use in high-density semiconductor integrated circuit devices at lower cost, higher manufacturing throughput, and increased product yield and reliability than are obtainable with conventional process methodology.

Additional advantages and other features of the present invention will be set forth in the description which follows and in part will become apparent to those having ordinary skill in the art upon examination of the following or may be learned from the practice of the instant invention. The advantages of the present invention may be realized and obtained as particularly pointed out in the appended claims.

According to an aspect of the present invention, the foregoing and other advantages are achieved in part by a method of manufacturing a semiconductor device, which method comprises the steps of:

(a) providing a device precursor structure comprising a semiconductor substrate of a first conductivity type and a layer stack formed on a portion of a surface of the substrate, the layer stack comprising:
  i. a thin gate insulating layer in contact with the substrate surface; and
  ii. a gate electrode layer formed on the gate insulating layer, the layer stack comprising a pair of opposing side surfaces and a top surface;

(b) forming a first, relatively narrow, insulative, tapered sidewall spacer on each of the pair of opposing side surfaces, the first sidewall spacers comprising a first dielectric material;

(c) forming a second, relatively wider, insulative, tapered sidewall spacer on each of the first sidewall spacers, the second sidewall spacers comprising a second dielectric material having an as-deposited etch resistance, said first and second dielectric materials of said first and second sidewall spacers being the same or different;

(d) treating the second sidewall spacers with impurities to reduce the etch resistance of the second dielectric material from its as-deposited state to a more readily-etched state;

(e) introducing dopant impurities of a second, opposite conductivity type into exposed portions of the substrate surface adjacent the first and second sidewall spacers to form a pair of spaced-apart, heavily-doped regions in the substrate;

(f) etching to selectively remove the impurity-treated second sidewall spacers;

(g) treating the pair of spaced-apart, heavily-doped regions to form a pair of heavily-doped source/drain regions in the substrate having a junction therewith at a predetermined depth below the substrate surface, each of the heavily-doped source/drain regions being laterally spaced from a respective proximal edge of the gate insulating layer by a distance substantially equal to the combined width of the lower ends of the first and second sidewall spacers adjacent the substrate surface;

(h) introducing second, opposite conductivity type dopant impurities into exposed portions of the substrate surface intermediate the gate insulating layer or the first sidewall spacers and the heavily-doped source/drain regions to form lightly- or moderately-doped extension regions; and (i) treating the lightly- or moderately-doped extension regions to form a pair of shallow-depth, lightly- or moderately-doped source/drain extensions in the substrate, each of the shallow-depth, lightly-doped source/drain extensions extending from a proximal edge of a respective heavily-doped source/drain region to just beneath a respective proximal edge of the gate insulating layer.

In embodiments according to the present invention, step (a) comprises providing a silicon wafer substrate of n or p first conductivity type, the thin gate insulating layer comprises a silicon oxide layer about 25–50 Å thick, and the gate electrode layer comprises heavily-doped polysilicon; step (b) comprises forming the first, relatively narrow, sidewall spacers from a dielectric material selected from silicon oxides, silicon nitrides, and silicon oxynitrides, each of the first, relatively narrow, tapered sidewall spacers having a width profile varying from up to about 200 Å at the lower end thereof adjacent the substrate surface to up to about 100 Å at the upper end thereof; step (c) comprises forming the relatively wider, second sidewall spacers from a dielectric material having an as-deposited etch resistance and selected from UV-nitrides and silicon oxides, nitrides, and oxynitrides, the UV-nitride dielectric material being formed by chemical vapor deposition (CVD), each of the second, relatively wider, tapered sidewall spacers having a width profile varying from about 100 to about 1,000 Å at the lower end thereof adjacent the substrate surface to up to about 400 Å at the upper end thereof; step (d) comprises ion implantation of the second sidewall spacers, comprising implanting ions selected from $Si^+$, $Ge^+$, and p and n type dopant ions at dosages of from about $1\times10^{14}$ to about $5\times10^{15}$ ions/cm$^2$ and energies of from about 1 to about 250 KeV; step (e) comprises implanting dopant ions of second, opposite conductivity type at dosages of from about $5\times10^{14}$ to about $5\times10^{15}$ ions/cm$^2$ and energies of from about 1 to about 250 KeV; step (f) comprises selectively removing the ion-implanted, reduced etching resistance second insulative sidewall spacers by etching with an HF-containing etchant, e.g., etching at a removal rate of from about 0.3 to about 5 Å/min. with 1:100 $HF/H_2O$ at about 20–35° C.; step (g) comprises rapid thermal annealing (RTA) to diffuse and activate the second conductivity type dopant impurities introduced during step (e) to form the pair of heavily-doped source/drain regions, each having a junction depth of from about 500 to about 2,000 Å below the substrate surface; step (h) comprises selectively implanting dopant ions of second conductivity type at dosages of from about $5\times10^{13}$ to about $1\times10^{15}$ atoms/cm$^2$ and energies of from about 0.2 to about 30 KeV; and step (i) comprises annealing, e.g., RTA to diffuse and activate the second conductivity type dopant impurities introduced during step (h) to form the pair of shallow-depth, lightly- or moderately-doped source/drain extensions, each having a shallow junction depth of from about 100 to about 1,000 Å below the substrate surface.

According to a further embodiment of the present invention, steps (d) and (e) are performed simultaneously by implanting dopant impurities of second, opposite conductivity type.

According to another aspect of the present invention, a method of manufacturing a silicon-based MOS-type transistor is provided, which method comprises the steps of:

(a) providing a MOS transistor precursor structure comprising a silicon semiconductor wafer substrate of a first conductivity type and a layer stack formed on a portion of a surface of the wafer, the layer stack comprising:

i. a thin gate insulating layer comprising a silicon oxide layer about 25–50 Å thick in contact with the wafer surface; and ii. a gate electrode layer comprising heavily-doped polysilicon formed on the gate insulating layer, the layer stack comprising a pair of opposing side surfaces and a top surface;

(b) forming a first, relatively narrow, insulative, tapered sidewall spacer on each of the pair of opposing side surfaces, the first sidewall spacers comprising a dielectric material selected from silicon oxides, silicon nitrides, and silicon oxynitrides;

(c) forming a second, relatively wider, insulative, tapered sidewall spacer on each of the first sidewall spacers, the second sidewall spacers comprising a UV-nitride dielectric material having an as-deposited etch resistance;

(d) implanting the second sidewall spacers with impurities to reduce the etch resistance from its as-deposited state to a more readily-etched state;

(e) implanting dopant impurities of a second, opposite conductivity type into exposed portions of the substrate surface adjacent the first and second sidewall spacers to form a pair of spaced-apart, heavily-doped implants in the wafer;

(f) etching with dilute aqueous HF to selectively remove the reduced etching resistance second pair of sidewall spacers;

(g) annealing to diffuse and activate the dopant impurities implanted in step (e), thereby forming a pair of heavily-doped source/drain regions in the wafer substrate having a junction therewith at a predetermined depth below the wafer surface and being laterally spaced from a respective proximal edge of the gate insulating layer by a distance substantially equal to the combined width of the lower ends of the first and second sidewall spacers adjacent the wafer surface;

(h) implanting second, opposite conductivity type dopant impurities into exposed portions of the wafer surface intermediate the gate insulating layer or the first sidewall spacer and the heavily-doped source/drain regions to form lightly- or moderately-doped extension regions; and (i) rapid thermal annealing to diffuse and activate the dopant impurities implanted in step (h), thereby forming a pair of shallow-depth, lightly- or moderately-doped source/drain extensions extending from a proximal edge of a respective source/drain region to just beneath a respective proximal edge of the gate insulating layer.

According to yet another aspect of the present invention, silicon-based MOS-type transistor devices formed by the method of the above-enumerated steps (a)–(i) are provided.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

DESCRIPTION OF THE INVENTION

The present invention addresses and solves problems arising from manufacturing submicron-dimensioned, MOS and CMOS transistors suitable for use in high-density integration semiconductor devices, wherein, as part of the fabrication methodology, sidewall spacers which act as at least part of an implantation mask during the formation of moderately- to heavily-doped source/drain regions are removed, as by etching, prior to implantation for forming lightly- or moderately-doped source/drain extensions. More specifically, the present invention advantageously provides a significant and substantial reduction in the duration and corrosive severity of the requisite wet chemical etching step for selectively removing the second, or outer sidewall spacers, thereby increasing device reliability and manufacturing throughput, while decreasing fabrication cost and product yield problems associated with the conventional technology. In addition, the inventive method is fully compatible with other aspects of existing processing methodology.

According to the present invention, a method of manufacturing MOS and CMOS transistors is provided which utilizes first and second dielectric sidewall spacer layers, the second, or outer, sidewall spacer layer comprising a dielectric material which has been treated, as by ion implantation, to reduce the etching resistance thereof from its as-deposited state to an easily and rapidly etched state. The first, or inner, sidewall spacer layer is comprised of a dielectric material which is the same as, or different from, the second, or outer, sidewall spacer layer and is retained throughout device processing for protecting the gate oxide and gate electrode layers from corrosive or physical attack during etching. The second, or outer, spacer layer is substantially wider than the first, inner spacer layer and provides a major portion of the masking function during ion implantation for forming moderately- to heavily-doped source/drain regions spaced a predetermined distance from respective proximal edges of the gate insulator/gate electrode layer stack. The impurity-treated second sidewall spacers are readily removed by etching prior to any post-implantation thermal annealing treatment for dopant activation and lattice damage relaxation, which thermal treatment may disadvantageously result in densification of the second sidewall spacer material, with a concomitant increase in the etching resistance thereof. By contrast, the thinner first, or inner, sidewall spacers, which are retained throughout device processing for protecting the gate insulator/gate electrode layer stack from corrosive or physical attack during etching for second spacer removal (as well as during subsequent metallization for contact formation), may receive a post-deposition thermal treatment for densification and increase of the etching resistance thereof.

Referring now to FIGS. 1(A)–1(J), shown therein is a sequence of steps for performing an illustrative, but not limitative, MOS-based embodiment of the present invention, wherein similar reference numerals are used throughout to denote similar features. As will be apparent to one of ordinary skill in the art, the inventive process may be readily adapted for use in the manufacture of CMOS transistors and similar devices. It should also be recognized that the process steps and structures described below do not necessarily form a complete process flow for manufacturing such semiconductor devices. However, the present invention can be practiced in conjunction with conventional integrated circuit fabrication techniques and methodologies currently employed in the art, and only so much of the commonly practiced process steps are included here as are necessary for an understanding of the present invention. As employed throughout the present disclosure and claims, the term "substrate" and or "semiconductor wafer substrate" includes, e.g., a semiconductor substrate per se or an epitaxial layer formed on a suitable semiconductor substrate. Finally, the figures representing cross-sections of portions of a semiconductor device during fabrication processing are not drawn to scale, but instead are drawn as to best illustrate the features of the present invention.

Figure 1A:
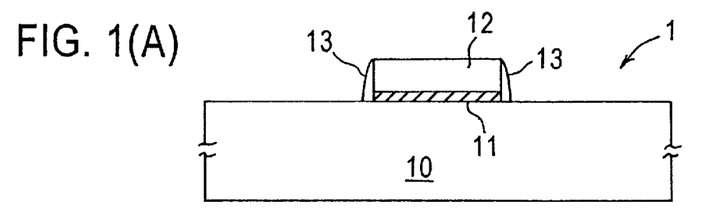
FIGS. 1(A)–1(J) illustrate, in simplified, cross-sectional form, a sequence of processing steps for forming an MOS-type transistor according to an embodiment of the present invention, wherein like reference numerals are employed throughout for designating like features and/or components of the invention.

Referring more particularly to FIG. 1(A), in a first step, a MOS device precursor 1, fabricated according to conventional techniques not described herein in order not to unnecessarily obscure the present invention, is provided, comprising a doped monocrystalline silicon (Si) substrate 10 of first conductivity type (p or n), with a thin gate dielectric layer 11, typically of a silicon oxide about 25–50 Å thick, formed on a portion of the substrate surface destined to overlie the channel region of the transistor. Contiguous and forming a layer stack with the gate dielectric layer 11 is a thicker gate electrode layer 12, typically of heavily-doped polysilicon, for providing electrical contact to the gate or channel region. First, or inner, insulative sidewall spacer layers 13 of a dielectric material, preferably a silicon oxide, nitride, or oxynitride, are formed in conventional manner (as by blanket deposition or thermal growth of a silicon oxide layer over the entire substrate surface, followed by anisotropic etching of the horizontally aligned surfaces thereof), on each of the opposing side surfaces of the gate insulator/gate electrode layer stack 11/12. Sidewall spacer layers 13 are each formed with a predetermined tapered width profile, the widths thereof varying from up to about 200 Å at the lower ends in contact with the surface of the substrate 10 to up to about 100 Å at the upper ends. In addition to the above-enumerated dielectric materials, the first, or inner, sidewall spacers 13 may, if desired, be comprised of the same dielectric material used for the subsequently formed second, or outer, sidewall spacers. Further, the resistance of the as-deposited, undensified first sidewall spacer layer materials to etching with, e.g., dilute aqueous HF, may be increased by subjecting the as-deposited first sidewall spacer layers 13 to a thermal treatment for densification, e.g., rapid thermal annealing (RTA) at a temperature of from about 900 to about 1,050° C. for from about 5 to about 30 seconds. In addition, the etch resistance of the first spacers 13 can be maintained by selecting the impurity implantation conditions for reducing the etch resistance of the second spacers such that they experience little or no lattice damage during the implantation process.

Figure 1B:
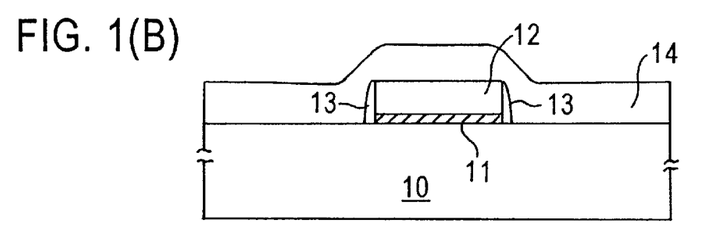

Referring now to FIG. 1(B), a layer 14 of a dielectric material, e.g., UV-nitride, is blanket-deposited over the surface of the dielectric gate oxide/gate electrode layer stack 11/12 by CVD. UV-nitride layers 14 formed in such manner are undensified as-deposited and fairly easily etched with HF-containing etchants, e.g., at etch rates with dilute aqueous HF (1:100 HF/$H_2O$) of from about 1 to about 3 Å/min. at moderate temperatures of from about 20 to about 35° C. Densified UV-nitride layers, such as are obtained subsequent to thermal annealing treatment at elevated temperatures, are substantially more difficult-to-etch under essentially equivalent conditions; consequently, according to the inventive method, device processing at elevated temperatures is avoided prior to removal of the second sidewall spacer layers, as will be explained below. Other fairly easily etched, undensified dielectric materials suitable for use as layer 14 include low temperature-deposited silicon oxides, nitrides, and oxynitrides.

Figure 1C:
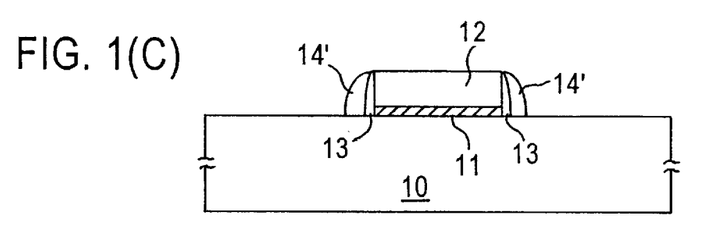

FIG. 1(C) shows the result of anisotropic etching of the horizontally oriented surfaces of the as-deposited, undensified UV-nitride layer 14, as by conventional reactive plasma techniques typically utilizing a fluorocarbon- or fluorohydrocarbon-containing gas. Selective removal of the horizontally oriented portions of the UV-nitride layer overlying the substrate 10 surface and the upper surface of the gate electrode layer 12 results in the formation of approximately quarter circle-shaped second, or outer, sidewall spacer layers 14' in contact with the outer surfaces of the first insulative sidewall spacers 13. The relatively wide second sidewall spacers 14' have a tapered width profile in cross-section varying from about 100 to about 1,000 Å at the wider, lower ends thereof in contact with the surface of the substrate 10 to up to about 400 Å at their narrower, upper ends. Inasmuch as the relatively wide second sidewall spacers 14' provide the major portion of the masking function of the sidewall spacers during subsequent dopant ion implantation, the conditions for the selective anisotropic etching of the as-deposited, undensified UV-nitride layer are selected so as to yield a desired width of the second sidewall spacer layers 14' at their lower ends.

Figure 1D:
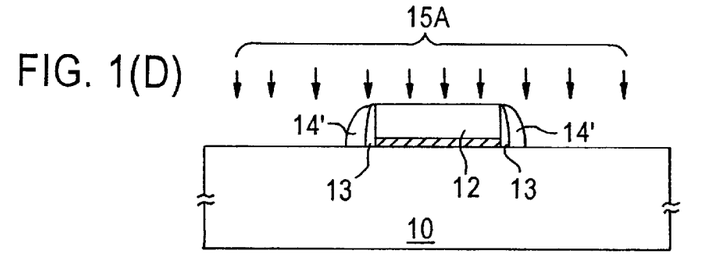

Adverting to FIG. 1(D), following formation of second sidewall spacers 14' of predetermined width profile, the latter are then treated, as by ion implantation thereinto, for reducing the resistance thereof against etching, e.g., with a HF-based etchant such as dilute aqueous HF at about room temperature. Stated differently, the second, or outer, sidewall spacers 14' are selectively treated to augment the difference in HF etch rate vis-à-vis the first, or inner, sidewall spacers 13. Implantable species 15A which may be employed for increasing the etchability of e.g., the UV-nitride and silicon oxide, nitride, and oxynitride undensified dielectric materials employed as second sidewall spacers 14' according to the inventive method, include $Si^+$ and $Ge^+$ ions, as well as p and n type dopants such as boron, phosphorus, arsenic, and antimony-containing ions. Suitable implantation dosages and energies of ions 15A can be selected for achieving satisfactory or optimum etching rates for a particular application and typically are from about $1\times10^{14}$ to about $5\times10^{15}$ ions/$cm^2$ and from about 1 to about 250 KeV, respectively. By way of illustration but not limitation, the etch rate with 1:100 HF/$H_2O$ (at 20–35° C.) of undensified, as-deposited UV-nitride outer sidewall spacers 14', formed as described above, is further increased from about 0.1–0.5 Å/min. to about 0.3–5 Å/min. as a result of implantation of $Si^-$ or $Ge^+$ ions under conditions as described above. While the exact mechanism of the observed increase in etch rate is not known with certainty, and not desiring to being bound by any particular theory, it is believed that lattice damage of the undensified spacer material 14' upon ion implantation facilitates entry of etchant into the material, resulting in increased etchant penetration. In any event, the ease with which the second, or outer, sidewall spacers is etched, relative to the first, or inner, sidewall spacers, is substantially augmented as a consequence of the above-described selective implantation treatment.

Figure 1E:
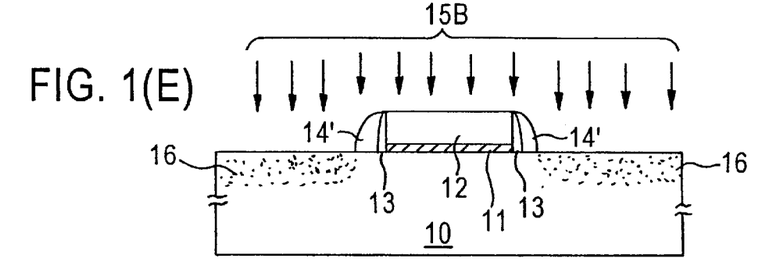

Referring now to FIG. 1(E), following augmentation of the etchability of second sidewall spacer layers 14' by selective implantation with ions 15A, dopant-containing ions 15B of second conductivity type opposite that of substrate 10 are implanted, with layer stack 11/12 and associated sidewall spacers 14' acting as implantation masks, to form moderately to heavily-doped regions 16. Dopant ion implantation is performed at a dosage and energy selected for optimal transistor performance. For example, by way of illustration but not limitation, for a p-type Si substrate intended to comprise an n-channel transistor, n-type dopant impurities 15B, typically chosen from phosphorus (P), arsenic (As), and antimony (Sb) ions, are implanted at a dosage of from about $5\times10^{14}$ to about $5\times10^{15}$ atoms/$cm^2$ at an energy of from about 1 to about 250 KeV. Conversely, for an n-type Si substrate intended to comprise a p-channel transistor, p-type dopant impurities 15B (typically boron or boron-containing) are implanted at similar dosages but at lower energies of from about 1 to about 40 KeV.

According to one variant of the present invention, the steps of treating the second sidewall spacers 14' by ion implantation to augment the etch rate thereof and forming heavily-doped regions 16 are performed simultaneously in a single step, in which case ions 15A and 15B are identical and are implanted under a single set of conditions. According to another variant of the present invention, the steps shown in FIGS. 1(D) and 1(E) are reversed in sequence, i.e., implantation of heavily-doped regions 16 is performed prior to impurity implantation for augmenting the etchability of second spacers 14'.

Figure 1F:
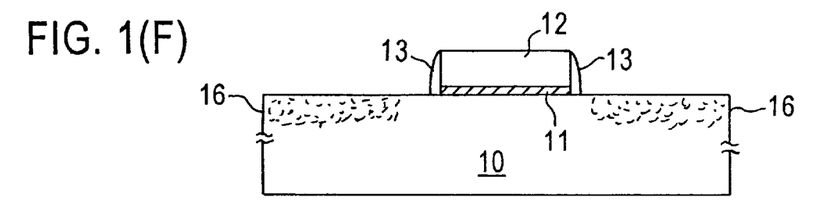

With reference now to FIG. 1(F), in the next step of the process sequence, the undensified, augmented etch rate (i.e., ion implanted) second sidewall spacers 14' are removed by etching, e.g., with dilute aqueous HF in the case of UV-nitride spacers. Inasmuch as the spacer removal step is performed on undensified (i.e., non-heat treated), augmented etch rate spacer material, etching is readily and rapidly performed at ambient temperatures (e.g., 20–35° C.) which result in significantly less undesired collateral etching, wafer damage, and defect formation. For example, removal by etching of undensified, ion implanted, augmented etch rate UV-nitride spacers 14' with 1:100 HF/H$_2$O at 20–35° C. can be accomplished in about 3–5 min. As compared with the about 1.5 hour interval required for etching of silicon nitride spacers with hot H$_3$PO$_4$ at 180° C. according to the prior art, the process of the instant invention provides a substantial and significant reduction in the requisite duration and severity of etching conditions, thereby simultaneously increasing manufacturing throughput and reducing corrosive attack and resultant damage to the wafer workpiece. As illustrated, the densified, relatively etch-resistant, first, or inner, sidewall spacers 13 are substantially unaffected by the aforesaid etching process and remain in place throughout subsequent device fabrication processing. However, it is within the ambit of the present invention to remove minor portions of the first spacers 13, the etching resistance of which may have been reduced during the impurity implantation step. Conversely, a minor portion of the second spacers 14', e.g., a non-impurity doped portion, may be retained after etching for removal of the second spacers.

Figure 1G:
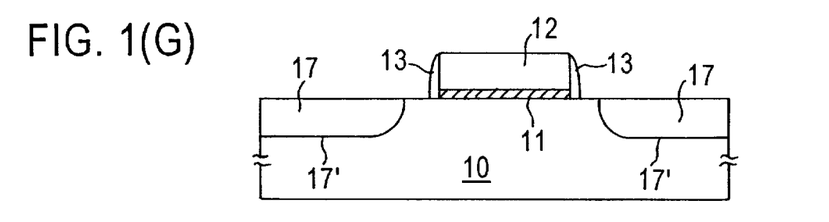

Referring now to FIG 1(G), following removal of sidewall spacers 14', the thus-formed transistor precursor is treated, as by rapid thermal annealing (RTA), so as to form source/drain regions 17 having a predetermined junction depth below the substrate 10 surface. In the case of moderately to heavily-doped n-type source/drain regions 17, RTA is conducted at a temperature of from about 900 to about 1,075° C., typically about 1,000° C., for from about 5 to about 45 seconds, typically about 30 seconds, to activate and diffuse the implanted dopant ions 15B and reduce/relax lattice damage, stress, and distortion resulting from the implantation process. N-type junction 17' depth is from about 500 to about 2,000 Å below the substrate surface, typically about 1,500 Å. In the case of moderately- to heavily-doped p-type source/drain regions 17, RTA is performed at a temperature of from about 900 to about 1,000° C., typically about 1,000° C., for from about 5 to about 45 seconds, typically about 10 seconds, for effecting dopant activation, diffusion, and lattice damage relaxation. P-type junction 17' depth is typically from about 500 to about 2,000 Å, typically about 1,500 Å.

Figure 1H:
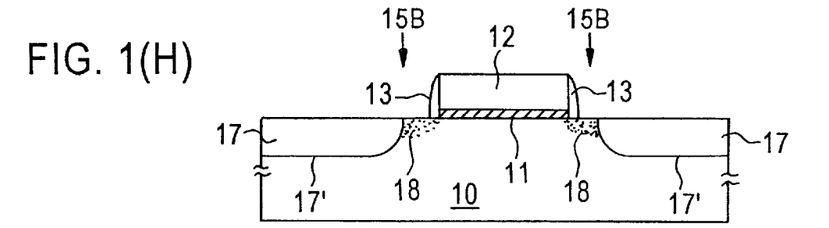

Referring now to FIG. 1(H), in the next step according to the inventive method, dopant containing ions 15B of opposite second conductivity type to that of semiconductor substrate 10 are implanted to form shallow, lightly or moderately-doped extension regions 18 ("extension implants") in the spaces between the moderately to heavily-doped source/drain regions 17 and just underlying the respective proximal edges of the gate insulator/gate electrode layer stack 11/12. Implantation is performed at lower dosages and energies than previously employed for forming source/drain regions 17. In the case of n-type dopant impurities 15B, implantation is performed at a dosage of from about $5 \times 10^{13}$ to about $1 \times 10^{15}$ ions/cm$^2$ and at an energy of from about 0.2 to about 30 KeV. In the case of p-type dopant impurities 15B, implantation is performed at a similar dosage but at a lower energy of from about 0.2 to about 10 KeV.

Figure 1I:
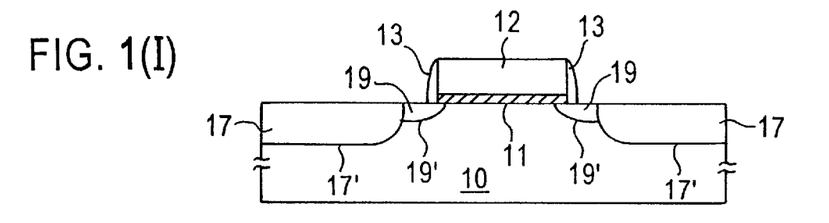

With reference to FIG. 1(I), the thus-implanted structure is then subjected to a thermal treatment, typically RTA, for activating/diffusing the implanted dopant impurities 15B in the shallow, lightly or moderately-doped extension regions 18 and for relaxation of lattice damage and stress resulting from the implantation process, thereby forming shallow, lightly or moderately-doped source/drain extensions 19 with resultant junction 19' depth (p-type or n-type) of from about 100 to about 1,200Å.

Figure 1J:
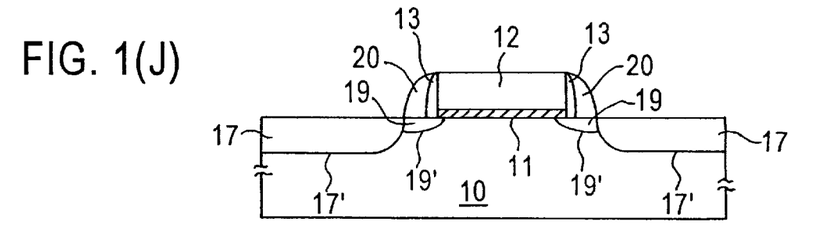

As shown in FIG. 1(J), second, or outer, insulative sidewall spacers 20 are then re-formed over the first, or inner, sidewall spacers 13, as by conventional techniques not described herein for brevity, along the opposing side surfaces of the gate insulator/gate electrode layer stack 11/12, for protecting the layer stack and source/drain extensions 19 during subsequent processing, e.g., for silicide contact formation. The re-formed second sidewall spacers 20 may comprise one or more dielectric material layers selected from silicon oxides, silicon nitrides, silicon oxynitrides, and UV-nitrides.

The present invention thus enables formation of reliable, defect-free submicron-dimensioned MOS transistors at increased rates of manufacturing throughput, by utilizing a readily etchable material for the second, relatively wide dielectric sidewall spacers, which material provides a very significant reduction in the time necessary for etching processing. In addition, the etching is performed under milder conditions, vis-à-vis the hot phosphoric acid etching according to the prior art, whereby deleterious effects due to long periods of exposure to the hot etchant are significantly reduced or eliminated.

The present invention is applicable to the formation of various types of submicron-dimensioned transistors, including CMOS transistors as well as MOS transistors, and is fully compatible with conventional process flow for automated manufacture of high-density integration semiconductor devices.

In the previous description, numerous specific details are set forth, such as specific materials, structures, reactants, processes, etc. in order to provide a better understanding of the present invention. However, the present invention can be practiced without resorting to the details specifically set forth. In other instances, well-known processing materials and techniques have not been described in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, which method comprises the steps of:
   (a) providing a device precursor structure comprising a semiconductor substrate of a first conductivity type and a layer stack formed on a portion of a surface of said substrate, said layer stack comprising:
      i. a thin gate insulating layer in contact with said substrate surface; and
      ii. a gate electrode layer formed on said gate insulating layer, said layer stack comprising a pair of opposing side surfaces and a top surface;
   (b) forming a first, relatively narrow, insulative, tapered sidewall spacer on each of said pair of opposing side surfaces, said first sidewall spacers comprising a first dielectric material;
   (c) forming a second, relatively wider, insulative, tapered sidewall spacer on each of said first sidewall spacers, said second sidewall spacers comprising a second dielectric material having an as-deposited etch resistance, said first and second dielectric materials of said first and second sidewall spacers being the same or different;

(d) treating the second sidewall spacers to reduce the etch resistance of said second dielectric material from its as-deposited state to a more readily-etched state;
(e) introducing dopant impurities of a second, opposite conductivity type into exposed portions of said substrate surface adjacent said first and second sidewall spacers to form a pair of spaced-apart, heavily-doped regions in said substrate;
(f) etching to selectively remove the second sidewall spacers;
(g) treating said pair of space-apart, heavily-doped regions to form a pair of heavily-doped source/drain regions in said substrate each having a junction therewith at a predetermined depth below said substrate surface, each of said heavily-doped source/drain regions being laterally spaced from a respective proximal edge of said gate insulating layer by a distance substantially equal to the combined width of the lower ends of said first and second sidewall spacers adjacent said substrate surface;
(h) introducing second, opposite conductivity type dopant impurities into exposed portions of said substrate surface intermediate said gate insulating layer or said first sidewall spacer and said heavily-doped source/drain regions to form lightly-or moderately-doped extension regions; and
(i) treating said lightly- or moderately-doped extension regions to form a pair of shallow-depth, lightly- or moderately-doped source/drain extensions in said substrate, each of said shallow-depth, lightly-doped source/drain extensions extending from a proximal edge of a respective heavily-doped source/drain region to just beneath a respective proximal edge of said gate insulating layer, wherein step (a) comprises providing a silicon wafer substrate of n or p first conductivity type, said thin gate insulating layer comprises a silicon oxide layer about 25–50 Å thick, and said gate electrode layer comprises heavily-doped polysilicon.

2. The method as in claim 1, wherein step (b) comprises forming said first, relatively narrow sidewall spacers from a first dielectric material selected from the group consisting of silicon oxides, silicon nitrides, and silicon oxynitrides.

3. The method as in claim 2, wherein each of said first, relatively narrow, tapered sidewall spacers has a width profile varying from up to about 200 Å at the lower end thereof adjacent said substrate surface to up to about 100 Å at the upper end thereof.

4. The method as in claim 1, wherein step (c) comprises forming said second, relatively wider, sidewall spacers from a second dielectric material having an as-deposited etch resistance and selected from the group consisting of UV-nitrides, silicon oxides, silicon nitrides, and silicon oxynitrides.

5. The method as in claim 4, wherein step (c) comprises forming said second, relatively wider, sidewall spacers from a CVD UV-nitride.

6. The method as in claim 1, wherein each of said second, relatively wider, tapered sidewall spacers has a width profile varying from about 100 Å to about 1,000 Å at the lower end thereof adjacent said substrate surface to up to about 400 Å at the upper end thereof.

7. The method as in claim 1, wherein step (d) comprises ion implantation of said second pair of sidewall spacers.

8. The method as in claim 7, wherein step (d) comprises implanting impurity ions selected from $Si^+$, $Ge^+$, and p and n type dopant ions at dosages of from about $1\times10^{14}$ to about $5\times10^{15}$ ions/cm$^2$ and energies of from about 1 to about 250 KeV.

9. The method as in claim 1, wherein step (e) comprises implanting dopant ions of second opposite conductivity type at dosages of from about $5\times10^{14}$ to about $5\times10^{15}$ ions/cm$^2$ and energies of from about 1 to about 250 KeV.

10. The method as in claim 9, wherein step (f) comprises selectively removing the ion-implanted, reduced etching resistance second insulative sidewall spacers by etching with dilute aqueous HF.

11. The method as in claim 10, wherein step (f) comprises etching the second insulative spacers at a removal rate of from about 0.3 to about 5 Å/min. with 1:100 HF/H$_2$O at about 20–35° C.

12. The method as in claim 1, wherein step (g) comprises rapid thermal annealing to diffuse and activate said second conductivity type dopant impurities introduced during step (e) to form said pair heavily-doped source/drain regions, each having a junction depth of from about 500 Å to about 2,000 Å below the substrate surface.

13. The method as in claim 1, wherein step (h) comprises selectively implanting dopant ions of second conductivity type at dosages of from about $5\times10^{13}$ to about $1\times10^{15}$ ions/cm$^2$ and energies of from about 0.2 to about 30 KeV.

14. The method as in claim 1, wherein step (i) comprises rapid thermal annealing to diffuse and activate said second conductivity type dopant impurities introduced during step (h) to form said pair of shallow-depth, lightly- or moderately-doped source/drain extensions, each having a shallow junction depth of from about 100 Å to about 1,000 Å below said substrate surface.

15. The method as in claim 1, comprising performing steps (d) and (e) simultaneously by implanting second conductivity type dopant impurities.

16. A method of manufacturing a silicon-based MOS-type transistor, which method comprises the steps of:
(a) providing a MOS transistor precursor structure comprising a silicon semiconductor wafer substrate of a first conductivity type and a layer stack formed on a portion of a surface of said wafer, said layer stack comprising:
   i. a thin gate insulating layer comprising a silicon oxide layer about 25–50 Å thick in contact with said wafer surface; and
   ii. a gate electrode layer comprising heavily-doped polysilicon formed on said gate insulating layer, said layer stack comprising a pair of opposing side surfaces and a top surface;
(b) forming a first, relatively narrow, insulative, tapered sidewall spacer on each of said pair of opposing side surfaces, said first sidewall spacers comprising a dielectric material selected from silicon oxides, silicon nitrides, and silicon oxynitrides;
(c) forming a second, relatively wider, insulative, tapered sidewall spacer on each of said first sidewall spacers, said second sidewall spacers comprising a UV-nitride dielectric material having an as-deposited etch resistance;
(d) implanting said second sidewall spacers with impurities to reduce the etch resistance from its as-deposited state to a more readily-etched state;
(e) implanting dopant impurities of a second, opposite conductivity type into exposed portions of said substrate surface adjacent said first and second sidewall spacers to form a pair of spaced-apart, heavily-doped implants in said wafer;
(f) etching with dilute aqueous HF to selectively remove the second pair of sidewall spacers;

(g) rapid thermal annealing to diffuse and activate the dopant impurities implanted in step (e), thereby forming a pair of heavily-doped source/drain regions in said wafer substrate, each having a junction therewith at a predetermined depth below said wafer surface, and being laterally spaced from a respective proximal edge of said gate insulating layer by a distance substantially equal to the combined width of the lower ends of said first and second sidewall spacers adjacent said wafer surface;

(h) implanting second, opposite conductivity type dopant impurities into exposed portions of said wafer surface intermediate said gate insulating layer or said first sidewall spacer and said heavily-doped source/drain regions to form lightly- or moderately-doped extension regions; and (i) rapid thermal annealing to diffuse and activate the dopant impurities implanted in step (h), thereby forming a pair of shallow-depth, lightly- or moderately-doped source/drain extensions extending from a proximal edge of a respective source/drain region to just beneath a respective proximal edge of said gate insulating layer.

17. The method as in claim 16, wherein step (d) comprises implanting impurity ions selected from $Si^+$, $Ge^+$, and p and n type dopant ions at dosages of from about $1 \times 10^{14}$ to about $5 \times 10^{15}$ ions/cm$^2$ and energies from about 1 to about 250KeV.

18. The method as in claim 17, wherein step (f) comprises etching the second insulative spacers at a removal rate of from about 0.3 to about 5 Å/min. with 1:100 HF/H$_2$O at about 20–35° C.

19. A method of manufacturing a semiconductor device, which method comprises the steps of:

(a) providing a device precursor structure comprising a semiconductor substrate of a first conductivity type and a layer stack formed on a portion of a surface of said substrate, said layer stack comprising:
  i. a thin gate insulating layer in contact with said substrate surface; and
  ii. a gate electrode layer formed on said gate insulating layer, said layer stack comprising a pair of opposing side surfaces and a top surface;

(b) forming a first, relatively narrow, insulative, tapered sidewall spacer on each of said pair of opposing side surfaces, said first sidewall spacers comprising a first dielectric material;

(c) forming a second relatively wider, insulative tapered sidewall spacer on each of said first sidewall spacers, said second sidewall spacers comprising a second dielectric material having an as-deposited etch resistance, said first and second dielectric materials of said first and second sidewall spacers being the same;

(d) treating the second sidewall spacers to reduce the etch resistance of said second dielectric material from its as-deposited state to a more readily-etched state;

(e) introducing dopant impurities of a second, opposite conductivity type into exposed portions of said substrate surface adjacent said first and second sidewall spacers to form a pair of spaced-apart, heavily-doped regions in said substrate;

(f) etching to selectively remove the second sidewall spacers;

(g) treating said pair of spaced-apart, heavily-doped regions to form a pair of heavily-doped source/drain regions in said substrate each having a junction therewith at a predetermined depth below said substrate surface, each of said heavily-doped source/drain regions being laterally spaced from a respective proximal edge of said gate insulating layer by a distance substantially equal to the combined width of the lower ends of said first and second sidewall spacers adjacent said substrate surface;

(h) introducing second, opposite conductivity type dopant impurities into exposed portions of said substrate surface intermediate said gate insulating layer or said first sidewall spacer and said heavily-doped source/drain regions to form lightly-or moderately-doped extension regions; and (i) treating and lightly- or moderately-doped extension regions to form a pair of shallow depth, lightly- or moderately-doped source/drain extension in said substrate, each of shallow-depth, lightly-doped source/drain extensions extending from a proximal edge of a respective heavily-doped source/drain region to just beneath a respective proximal edge of said gate insulating layer.

20. The method as in claim 19, wherein step (b) comprises forming said first and second sidewall spacers from a dielectric material selected form the group consisting of silicon oxides, silicon nitrides, and silicon oxynitrides.

21. The method as in claim 19, wherein step (d) comprises ion implantation of said second pair of sidewall spacers.

22. The method as in claim 19, wherein step (f) comprises selectively removing the ion-implanted, reduced etching resistance second insulative sidewall spacers by etching with dilute aqueous HF.

23. The method as in claim 19, wherein step (g) comprises rapid thermal annealing to diffuse and activate said second conductivity type dopant impurities introduced during step (e) to form said pair heavily-doped source/drain regions, each having a junction depth of from about 500 Å to about 2,000 Å below the substrate surface.

24. The method as in claim 19, comprising performing steps (d) and (e) simultaneously by implanting second conductivity type dopant impurities.

25. The method as in claim 19, wherein step (f) comprises etching the second insulative spacers at a removal rate of from about 0.3 to about 5 Å/min.

26. A method of manufacturing a semiconductor device, which method comprises the steps of:

(a) providing a device precursor structure comprising a semiconductor substrate of a first conductivity type and a layer stack formed on a portion of a substrate of said substrate, said layer stack comprising:
  i. a thin gate insulating layer in contact with said substrate surface; and
  ii. a gate electrode layer formed on said gate insulating layer, said layer stack comprising a pair of opposing side surfaces and a top surface;

(b) forming a first, relatively narrow, insulative, tapered sidewall spacer on each of said pair of opposing side surfaces, said first sidewall spacers comprising a first dielectric material;

(c) forming a second, relatively wider, insulative, tapered sidewall spacer on each of said fist sidewall spacers, said second sidewall spacers comprising a second dielectric material having an as-deposited etch resistance, said first and second dielectric materials of said first and second sidewall spacers being the same or different;

(d) treating the second sidewall spacers to reduce the etch resistance of said second dielectric material from its as-deposited state to a more readily-etched state;

(e) introducing dopant impurities of a second, opposite conductivity type into exposed portions of said substrate surface adjacent the first and second sidewall spacers to form a pair of spaced-apart, heavily-doped regions in said substrate;

(f) etching to selectively remove the second sidewall spacers;

(g) treating said pair of spaced-apart, heavily-doped regions to form a pair of heavily-doped source/drain regions in said substrate each having a junction therewith at a predetermined depth below said substrate surface, each of said heavily-doped source/drain regions being laterally spaced from a respective proximal edge of said gate insulating layer by a distance substantially equal to the combined width of the lower ends of said first and second sidewall spacers adjacent said substrate surface;

(h) introducing second, opposite conductivity type dopant impurities into exposed portions of said substrate surface intermediate said gate insulating layer or said first sidewall spacer and said heavily-doped source/drain regions to form lightly- or moderately-doped extension regions; and (i) treating said lightly- or moderately-doped extension regions to form a pair of shallow-depth, lightly- or moderately-doped source/drain extensions in said substrate, each of said shallow depth, lightly-doped source/drain extensions extending from a proximal edge of a respective heavily-doped source/drain region to just beneath a respective proximal edge of said gate insulating layer; wherein steps (d) and (e) are conducted separately.

27. The method as in claim 26, wherein step (b) comprises forming said first and second sidewall spacers form a dielectric material selected from the group consisting of silicon oxides, silicon nitrides, and silicon oxynitrides.

28. The method as in claim 26, wherein step (d) comprises ion implantation of said second pair of sidewall spacers.

29. The method as in claim 28, wherein step (d) comprises implanting impurity ions selected from $Si^+$, $Ge^+$, and p and n type dopant ions at dosages of form about $1 \times 10^{14}$ to about $5 \times 10^{15}$ ions/cm$^2$ and energies of from about 1 to about 250 KeV.

30. The method as in claim 29, wherein step (d) comprises implanting $Si^+$, $Ge^+$, ions.

31. The method as in claim 26, wherein step (f) comprises etching the second insulative spacers at a removal rate of from about 0.3 to about 5 Å/min.

* * * * *